(12) United States Patent
Shen

(10) Patent No.: US 8,247,699 B2
(45) Date of Patent: Aug. 21, 2012

(54) FLEX CIRCUIT ASSEMBLY WITH A DUMMY TRACE BETWEEN TWO SIGNAL TRACES

(75) Inventor: Jr-Yi Shen, Sunnyvale, CA (US)

(73) Assignee: Hitachi Global Storage Technologies, Netherlands B.V., Amsterdam (NL)

( * ) Notice: Subject to any disclaimer, the term of this patent is extended or adjusted under 35 U.S.C. 154(b) by 685 days.

(21) Appl. No.: 12/242,408

(22) Filed: Sep. 30, 2008

(65) Prior Publication Data

US 2010/0078200 A1   Apr. 1, 2010

(51) Int. Cl.
  *H05K 1/00*   (2006.01)
(52) U.S. Cl. ........ 174/254; 174/255; 174/258; 174/260; 360/245.8; 360/245.9; 438/118; 439/66
(58) Field of Classification Search .............. 174/68.1, 174/250, 254–261, 268, 70 R, 73.1, 75 R
  See application file for complete search history.

(56) References Cited

U.S. PATENT DOCUMENTS

| | | | |
|---|---|---|---|
| 5,296,651 A | | 3/1994 | Gurrie et al. |
| 5,566,051 A | * | 10/1996 | Burns .......................... 361/704 |
| 5,901,014 A | * | 5/1999 | Hiraoka et al. ............ 360/234.5 |
| 6,027,958 A | * | 2/2000 | Vu et al. ...................... 438/110 |
| 2006/0011336 A1 | * | 1/2006 | Frul .............................. 165/185 |
| 2007/0148997 A1 | * | 6/2007 | Feldman et al. ................ 439/66 |
| 2007/0269929 A1 | | 11/2007 | Liao et al. |
| 2010/0027165 A1 | * | 2/2010 | Huang et al. ................... 360/264 |

FOREIGN PATENT DOCUMENTS

| | | |
|---|---|---|
| EP | 1841296 | 10/2007 |
| JP | 2003258390 | 9/2003 |
| JP | 2007273981 | 10/2007 |

OTHER PUBLICATIONS

Rogers Corporation, "Determination of Adhesive Thickness in Flexible Printed Circuits", *Rogers Corporation Advanced Circuit Materials*, (1994-2003),1-2.
Rogers Corporation, "Maximizing Flex Life in Flexible Printed Circuits—The Circuit Challenge: How can we maximize the flex life of our flexible printed circuits?", *Rogers Corporation Advanced Circuit Materials*, (1996-2003),1-4.
Rogers Corporation, "Determination of Flex Life in Flexible Printed Circuit", *Rogers Corporation Advanced Circuit Materials*, (1994-2003),1-2.
Zehnder, et al., "Reinforcing Effect of Coverlayers on the Fatigue Life of Copper-Kapton Flex Cables", *IEEE Transactions on Components, Packaging, and Manufacturing Technology-Part B*, vol. 18, No. 4, (Nov. 1995),704-708.

* cited by examiner

*Primary Examiner* — Courtney Smith

(57) ABSTRACT

A flex circuit comprises a base film, a first adhesive layer coupled with the base film, at least two signal traces coupled with the first adhesive layer, and at least one dummy trace positioned between the two signal traces and coupled with the first adhesive layer. The flex circuit comprises a second adhesive layer coupled with the signal traces, the dummy trace, and the first adhesive layer, and a cover film coupled with the second adhesive layer.

12 Claims, 8 Drawing Sheets

FLEX CIRCUIT ASSEMBLY WITH A DUMMY TRACE BETWEEN TWO SIGNAL TRACES

TECHNICAL FIELD

This invention relates generally to the field of flex circuits and in particular to mitigating a fatigue crack in a flex circuit.

BACKGROUND

Flex circuits are used to electrically couple components together such that relative motion between the components is made possible while maintaining electrical coupling. Relative motion between components can be desirable in either the assembly of the components or in their operation. If relative motion is provided by the flex circuit to facilitate assembly, the number of flex cycles can be as few as one or two flex cycles. If the relative motion provided by the flex circuit is required for the operation of the components, the flex cycles can be as much as several thousand to hundreds of millions of flex cycles.

Fatigue of a flex circuit is a concern for flex circuit designers and the users of flex circuits. The impact to a user of a flex circuit failing can vary from not being able to play music from a CD player to not being able to access data from a hard disk drive. The degree of impact to a user will depend on the device in which a flex circuit that fails is employed.

Fatigue of a flex circuit can occur when tensile stress is cyclically applied to the copper conductors, known as traces. The tensile stress can cause grains, and dislocations between the grains to move and align themselves such that a microscopic crack forms. Once a microscopic crack has formed, it can propagate under repeated tensile stress and grow into a separation in the trace and hence a crack that can prevent reliable electrical coupling.

SUMMARY OF THE INVENTION

Various embodiments of the present invention are described herein. A flex circuit comprises a base film, a first adhesive layer coupled with the base film, at least two signal traces coupled with the first adhesive layer, and at least one dummy trace positioned between the two signal traces and coupled with the first adhesive layer. The flex circuit comprises a second adhesive layer coupled with the signal traces, the dummy trace, and the first adhesive layer, and a cover film coupled with the second adhesive layer.

BRIEF DESCRIPTION OF THE DRAWINGS

The accompanying drawings, which are incorporated in and form a part of this specification, illustrate embodiments of the invention and, together with the description, serve to explain the principles of the invention.

Figure 1:
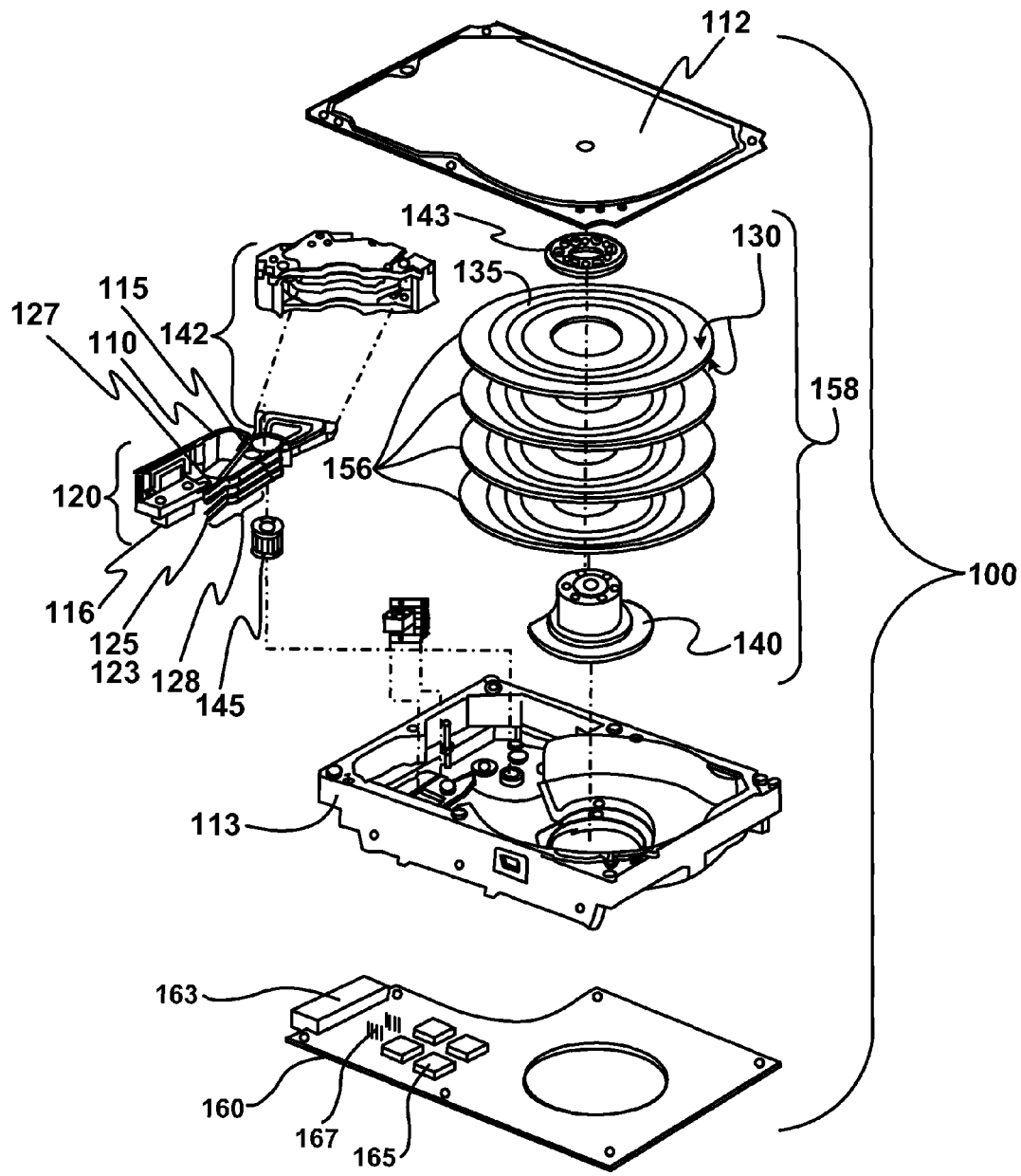
FIG. 1 is an isometric blow-apart of an HDD in accordance with one embodiment of the present invention.

The drawings referred to in this description should not be understood as being drawn to scale except if specifically noted.

DETAILED DESCRIPTION

Reference will now be made in detail to the alternative embodiment(s) of the present invention. While the invention will be described in conjunction with the alternative embodiment(s), it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of embodiments of the present invention, numerous specific details are set forth in order to provide a thorough understanding of the present invention. However, it will be recognized by one of ordinary skill in the art that embodiments of the present invention may be practiced without these specific details. In other instances, well known methods, procedures, and components have not been described in detail as not to unnecessarily obscure aspects of the present invention.

Flex circuits are widely used in a number of industries and products. They can be found in heart pacemakers for connecting electronic subassemblies, to robotic arms for enabling electrical coupling of components across a moveable joint. They can be found in everyday devices such as flip-up cell phones, CD players, printers and computers. Embodiments of the present invention improve the fatigue life of a flex circuit regardless of the device in which it is used. For the sake of brevity and clarity, embodiments of the present invention will be described as being applied in a computer hard disk drive (HDD).

Computers have become part of every day life, and as such, expectations and demands continually increase for greater speed for manipulating data, for holding larger amounts of data, and for higher reliability. To meet these demands for increased performance, the mechanical assembly in a computer, specifically the Hard Disk Drive (HDD) has undergone many changes.

Reliability is a major concern for users of HDDs since users are trusting large amounts of data, personal information, and in some instances, the viability of their business to the continued performance of an HDD. To meet these expectations, HDD designers strive to design components and subassemblies in the HDD to function for long periods of time without failure.

A device within the HDD, known as an actuator, moves a magnetic transducer rapidly across a disk surface during operation. A flex circuit enables data to be transferred between the actuator and a PC card while the actuator is moving the magnetic transducer across the disk surface. In the HDD industry, such a flex circuit is more commonly known as a flex cable. The conductors within the flex cable are commonly known as traces. The flex cable can experience fatigue cracks in its traces during operation. The flex cable and its traces need to be properly designed and manufactured to withstand the hundreds of millions of flex cycles it can experience during the operating life of the HDD.

The discussion will begin with a brief overview of a hard disk drive (HDD) which comprises a flex cable for communicatively coupling an actuator assembly to a printed circuit board, and conditions in which a fatigue crack can develop in a signal trace of the flex cable. The discussion will then focus on embodiments of the present invention by which an occurrence of a fatigue crack can be reduced in a flex cable. The implementation of embodiments of the present invention will then be discussed.

Overview

With reference to FIG. 1, an isometric blow-apart of HDD 100 is presented in accordance with an embodiment of the present invention. Base casting 113 provides coupling points for components and sub-assemblies such as disk stack 158, voice coil motor (VCM) 142, and head stack assembly (HSA) 120. Disk stack 158 is coupled with base casting 113 by means of motor-hub assembly 140 and disk clamp 143. Motor-hub assembly 140 will have at least one disk 156 coupled with it such that disk 156 can rotate about an axis common to motor-hub assembly 140 and the center of disk 156. Disk 156 has at least one disk surface 130 upon which reside data tracks 135. HSA 120, at times referred to as an actuator assembly or carriage, comprises suspension 127, which suspends hard disk drive slider 125 next to disk surface 130, and HSA connector 116. Hard disk drive slider 125 is comprised of magnetic transducer 123 which reads and writes data to and from data tracks 135. Suspension 127 and hard disk drive slider 125 comprise head gimbal assembly (HGA) 128. Flex cable 110, which is part of actuator assembly 120, conveys data between HSA connector 116 and arm electronics (A/E) module 115. HSA connector 116 also conveys control data between printed circuit board (PCB) 160 and VCM 142.

HSA 120, hereafter referred to as actuator assembly 120, is coupled pivotally with base casting 113 by means of pivot bearing 145, such that VCM 142 can move HGA 128 with slider 125 arcuately across disk surface 130, accessing data tracks 135. Upon assembly of actuator assembly 120, disk stack 158, VCM 142, and other components with base casting 113, cover 112 is coupled with base casting 113 to enclose these components and sub-assemblies into HDD 100.

Once cover 112 is coupled with base casting 113, PCB 160 is coupled to base casting 113. PCB 160 comprises at least one electrical component 165 which in general performs the electrical tasks of HDD 100, such as status check of HDD 100 before writing data, power control for motor-hub assembly 140, and servo control of VCM 142. VCM 142 is electrically coupled with PCB 160 via HSA connector 116 and an appropriately mating connection 167 on PCB 160. Electrical coupling of HDD 100 to a host system in which HDD 100 operates is enabled in part through PCB connector 163, coupled to PCB 160.

Figure 2:
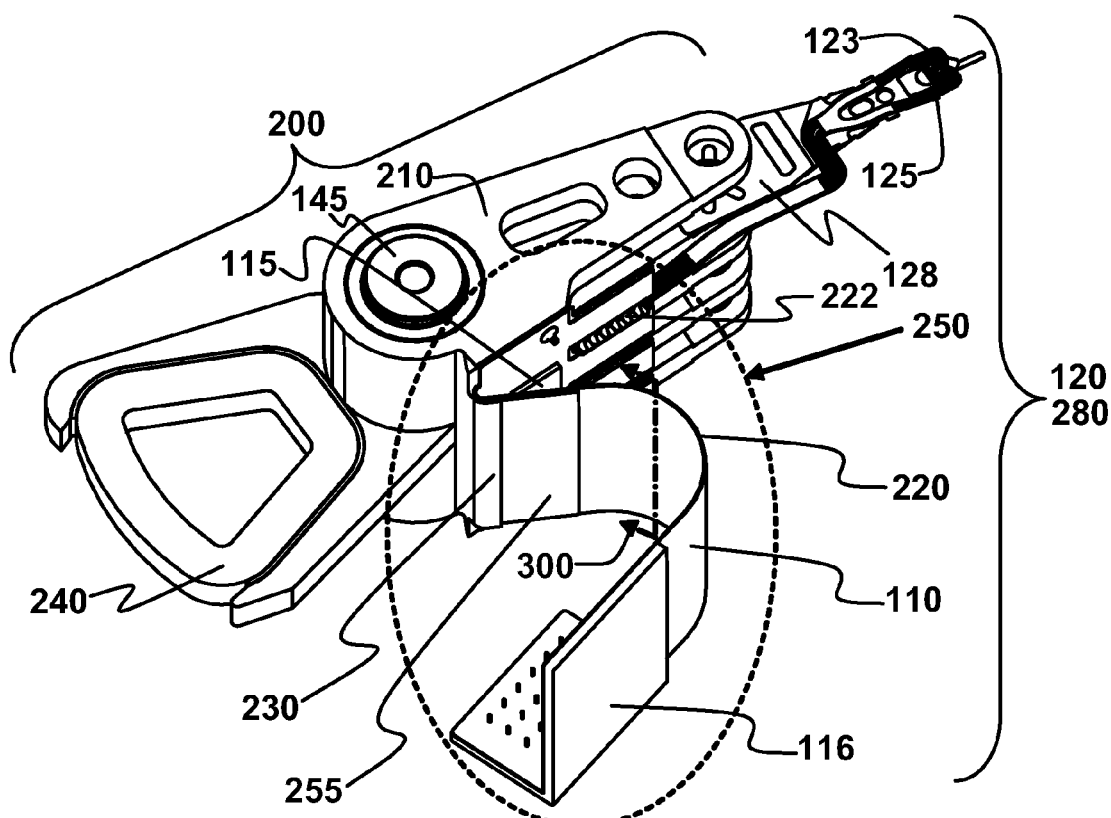
FIG. 2 is an isometric of an actuator assembly in accordance with one embodiment of the present invention.

With reference to FIG. 2, the hierarchy of subassemblies and assemblies is defined as follows: Flex cable assembly 250 is a subassembly which can be coupled with comb 210. In general, flex cable assembly 250 comprises flex cable 110 for conducting data signals from actuator assembly 120 to HSA connector 116. Flex cable 110 is a component to which other components can be added, such as A/E module 115, HSA connector 116, constrained layer damper (CLD) 255, and coupler 230, wherein assembled comprises flex cable assembly 250. Comb assembly 200 is a subassembly which is operable to receiving at least one HGA 128. In general, comb assembly 200 comprises, comb 210, voice coil 240, and flex cable assembly 250. Coupling at least one HGA 128 with comb assembly 200 comprises actuator assembly 120. Coupling pivot bearing 145 with actuator assembly 120 comprises actuator 280.

Components can be interchanged or shared between subassemblies while maintaining the spirit of the definitions of the aforementioned assemblies and subassemblies. Embodiments of the present invention, and as presented in FIG. 2, are applicable to the aforementioned assemblies and subassemblies as well as HDD 100 in which flex cable 110 is a component.

Flex cable 110 conveys data between HSA connector 116 and A/E module 115 while allowing actuator 280 to arcuately move across disk surface 130, accessing data tracks 135. During a normal life of HDD 100, flex cable 110 can undergo hundreds of millions of flex cycles. It is expected by users and designers of HDD 100 for flex cable 110 to flex and convey data between HSA connector 116 and A/E module 115 reliably and without failure.

Physical Description

With continued reference to FIG. 2, actuator assembly 120 is presented in accordance with an embodiment of the present invention. Comb assembly 200, when coupled with actuator assembly 120 and pivot bearing 145, is operable to arcuately moving magnetic transducer 123 across data tracks 135 in HDD 100. Comb assembly 200 comprises a flex cable assembly 250, wherein flex cable assembly 250 has flex cable 110 for conducting data signals from actuator assembly 120 to HSA connector 116, and CLD 255. Flex cable 110 comprises a dynamic loop section 220 between termination 222 for actuator assembly 120 and HSA connector 116. CLD 255 is attached to dynamic loop section 220 of flex cable 110 and attached adjacently to an area of flex cable 110 configured for receiving coupler 230.

CLD 255 is coupled with flex cable 110 such that CLD 255 spans an area of flex cable 110 where, upon operation in HDD 100, there is relative motion between actuator assembly 120 and dynamic loop section 220. A damper is designed to primarily reduce the gain of the frequency of vibration. A damper, such as CLD 255 is well known and understood by one of ordinary skill in the art. In brief CLD 255 dampens vibration by cyclically deforming a damping material that is covered on at least one surface by a material stiffer than the damping material. The stiffer material constrains the damping material as it is cyclically deformed by the vibration and imparts strain into the damping material. The damping material resists deformation and converts the strain energy into small amounts of heat.

Vibration of flex cable 110 is a significant cause for delaying magnetic transducer 123 to settle on data track 135. The use of CLD 255 has proven to be an effective method for reducing the gain of the frequency of vibration due to flex cable 110. A consequence to coupling CLD 255 with flex cable 110 is a discontinuity in the thickness of flex cable assembly 250 which results in a stress concentration on dynamic loop section 220.

Stress concentrators are well known and understood by one of ordinary skill in the art. Briefly, a stress concentrator is an abrupt change in the topography and/or shape of an object that will be subjected to deformation. A stress concentrator is usually a concern since fatigue and cracking can occur at stress concentrators when a flex cable is subjected to flexing. Other stress concentrators occur at the boundaries of flex cable 110 with HSA connector 116 and coupler 230. The boundaries of flex cable 110 with HSA connector 116 and coupler 230 are usually designed to be rigid and have relatively little flexing of the flex cable 110 at these boundaries.

The boundaries of flex cable 110 with HSA connector 116 and coupler 230 are usually of little concern as locations for fatigue cracking.

Figure 3:
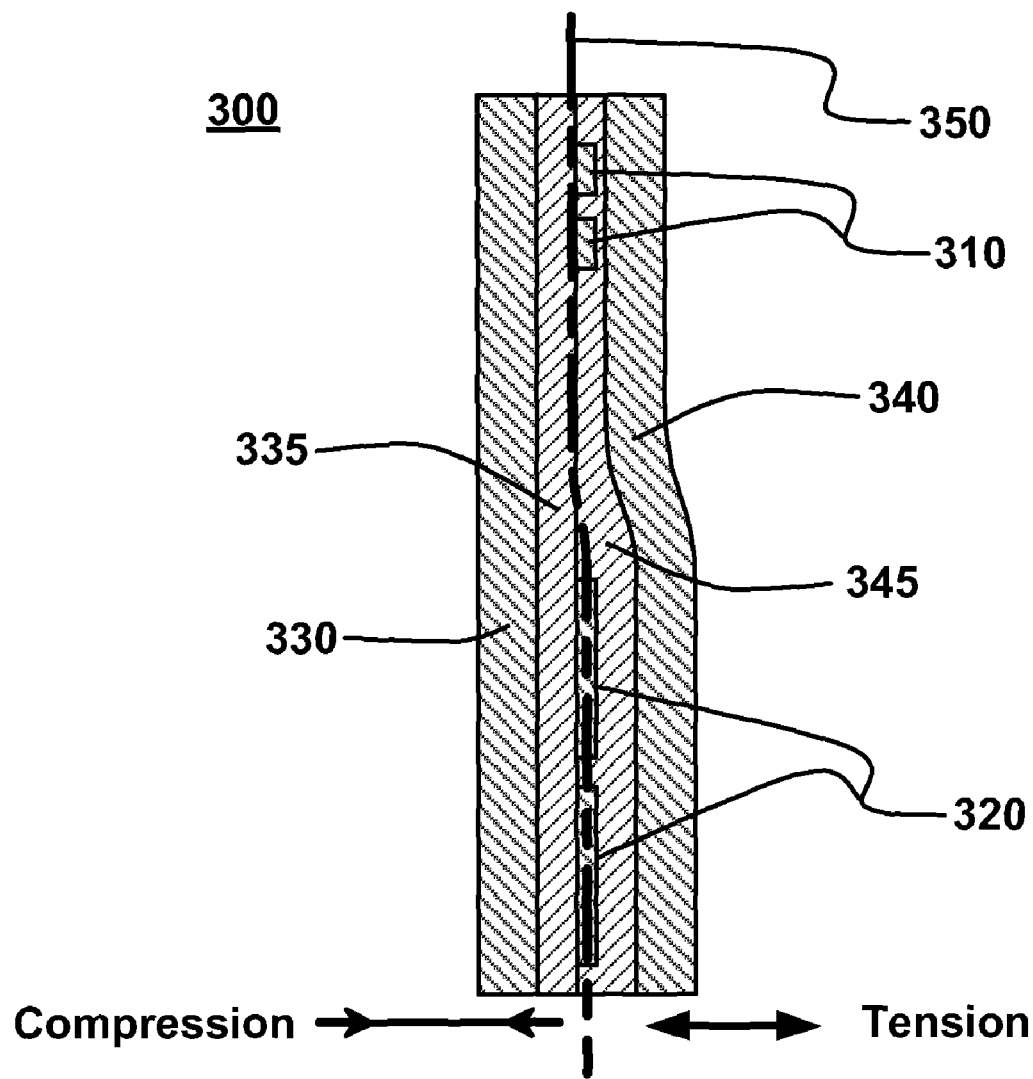
FIG. 3 is a cross-section of a flex cable for an actuator operable to embodiments of the present invention.

FIG. 3 is a cross-section 300 of a flex cable for an actuator which is operable to embodiments of the present invention. Cross-section 300 is taken from FIG. 2, which is an isometric of actuator assembly 120 in accordance with one embodiment of the present invention. FIG. 2 is used in conjunction with cross-section 300 to demonstrate the configuration of an actuator assembly which has not received the benefits of embodiments of the present invention. With reference to FIG. 3, cross-section 300 presents a condition common to flex cables and flex circuits which have not received the benefits of embodiments of the present invention. This condition is that neutral axis 350 varies in location with respect to signal trace(s) (310, 320).

A neutral axis is an inherent characteristic of all objects deformed by bending. A neutral axis is well known and understood by one of ordinary skill in the art. Briefly, a neutral axis is a two-dimensional representation of a plane in an object where compressive stresses and tensile stresses are balanced and has net zero stress. For a homogeneous object, the neutral axis coincides with that plane which equally divides the geometry of the object and is perpendicular to a force that will cause the object to bend. For a non-homogeneous object, the neutral axis is perpendicular to a force that will cause the object to bend and coincides with that plane which equally divides the stiffness of the non-homogeneous components of the object. For a non-homogeneous object with non-homogeneous components arranged symmetrically, such as a flex cable, the neutral axis coincides with that plane which equally divides the geometry of the object and is perpendicular to a force that will cause the object to bend.

Typically a flex circuit or a flex cable such as the flex cable presented in cross-section 300 of FIG. 3 has non-homogeneous layers applied symmetrically, i.e. base film 330 is made with similar material as cover film 340; first adhesive layer 335 and second adhesive layer 345 are made with similar material, but are different than the material used for making base film 330 and cover film 340. Base film 330 and cover film 340 comprise the outer most layers of the flex cable presented in cross-section 300. Adhered to base film 330 and cover film 340 are first adhesive layer 335 and second adhesive layer 345 respectively. Adhered to both first adhesive layer 335 and second adhesive layer 345 is signal trace(s) (310, 320). Thus a symmetric non-homogeneous flex cable is presented in cross-section 300 of FIG. 3.

As presented in cross-section 300 of FIG. 3, neutral axis 350 is symmetric with the geometry of the flex cable, but varies in location with respect to signal trace(s) (310, 320). This is due to second adhesive layer 345 flowing into spaces having different volumes around signal trace(s) (310, 320). Signal trace(s) 320 is wider than signal trace(s) 310. More volume of second adhesive layer 345 flows around signal trace(s) 310, leaving less second adhesive layer 345 between cover film 340 and signal trace(s) 310. Hence the thickness of flex cable 110 is less in the vicinity of signal trace(s) 310.

Since the thickness of the flex cable presented in cross-section 300 of FIG. 3 is less in the vicinity of signal trace(s) 310 as compared to the vicinity of signal trace(s) 320, neutral axis 350 is located differently in the vicinity of signal trace(s) 310 as compared to the vicinity of signal trace(s) 320. Neutral axis 350 is approximately centered with signal trace(s) 320 and is off center with signal trace(s) 310. The implication of neutral axis 350 being off-centered with signal trace(s) 310 is there will be an imbalance of compressive and tensile stress in signal trace(s) 310.

With continued reference to FIG. 2 and FIG. 3, cross-section 300 is taken through dynamic loop section 220. The concave side of dynamic loop section 220 comprises base film 330. The convex side of dynamic loop section 220 comprises cover film 340. It is appreciated that the concave side of an object in bending, such as the flex cable presented in cross-section 300 of FIG. 3, is in compression. It is appreciated that the convex side of an object in bending, such as the flex cable presented in cross-section 300 of FIG. 3, is in tension. Since signal trace(s) 310 is on the tension side of neutral axis 350, signal trace(s) 310 is also in tension.

A trace in tension with little to no compression and under cyclical bending, such as that experienced by dynamic loop section 220, is prone to fatigue cracking and failure. Adding a damper, such as CLD 255 creates a stress concentrator and exacerbates the potential for a fatigue failure. Through experimentation, with neutral axis 350 similarly positioned as presented in cross-section 300 of FIG. 3 and the coupling of a damper similar to CLD 255 presented in FIG. 2, a fatigue crack can occur in signal trace (310, 320) in as few as 100 hours of simulated customer operation of HDD 100.

In accordance with embodiments of the present invention, dummy traces are added in between signal traces of a flex cable/circuit, whereby less volume of a second adhesive layer, which laminates a cover film to the signal trace(s), is consumed. In so doing, the thickness of the flex cable/circuit is controlled as well as the location of the neutral axis as a function of the location, width, and space around the dummy trace. A dummy trace is a trace that is not electrically coupled to an active electrical component.

Figure 4:
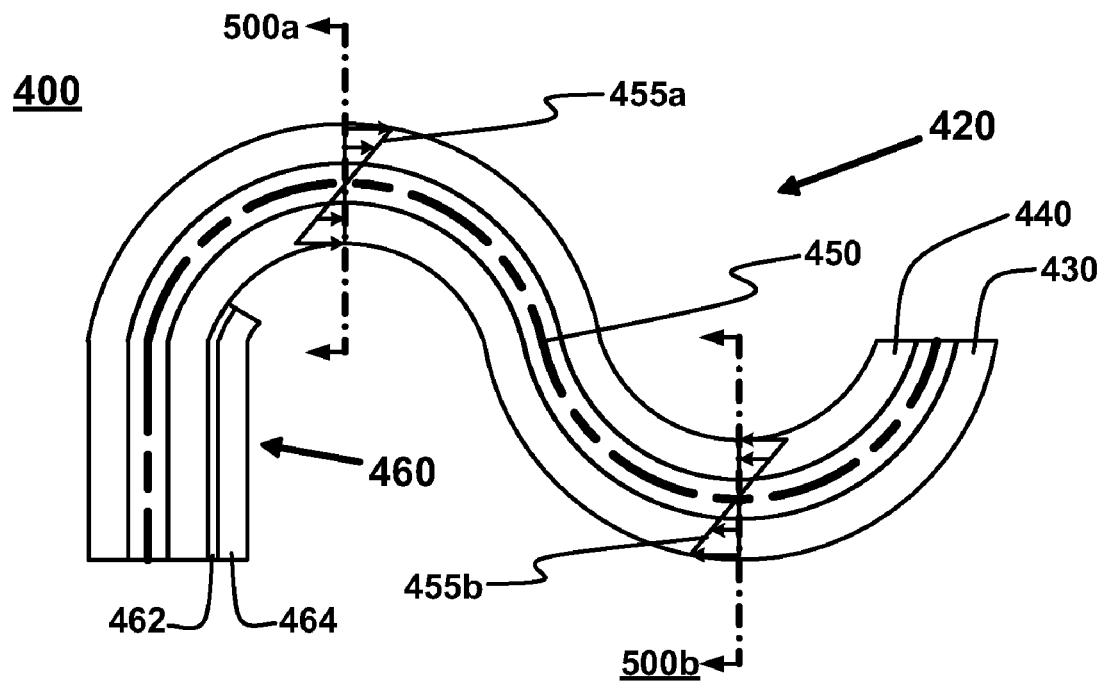
FIG. 4 is a flex cable/circuit having a dynamic loop in accordance with one embodiment of the present invention.

With reference to FIG. 4, flex cable/circuit 400, having dynamic loop 420, is presented in accordance with one embodiment of the present invention. Dynamic loop 420 comprises two bends in opposite directions and is an example of a flex cable/circuit that can undergo simultaneous compressive and tensile stresses on one side of a flex cable/circuit. Cross-section 500a and cross-section 500b are located at the centers of the two bends. Stress diagram 455a, which is well known and understood by one of ordinary skill in the art, shows the transition from maximum tensile stress at the outer most fiber of cover film 440, through zero stress at neutral axis 450, to maximum compressive stress at the outer most fiber of base film 430. Stress diagram 455b, which is well known and understood by one of ordinary skill in the art, shows the transition from maximum compressive stress at the outer most fiber of cover film 440, through zero stress at neutral axis 450, to maximum tensile stress at the outer most fiber of base film 430.

Dynamic loop 420 of flex cable/circuit 400 presents an extreme case of multiple bends in a dynamic loop. Embodiments of the present invention are applicable to this extreme case as well as the single bend dynamic loop section 220 of flex cable 110 presented in FIG. 2. Fatigue cracking in a trace of a flex cable/circuit is avoidable if the neutral axis can be positioned in the approximate center of the trace. Fatigue cracking in a trace of a flex cable/circuit is also avoidable if the neutral axis can be positioned such that there is more compressive stress than tensile stress in the trace.

Figure 5A:
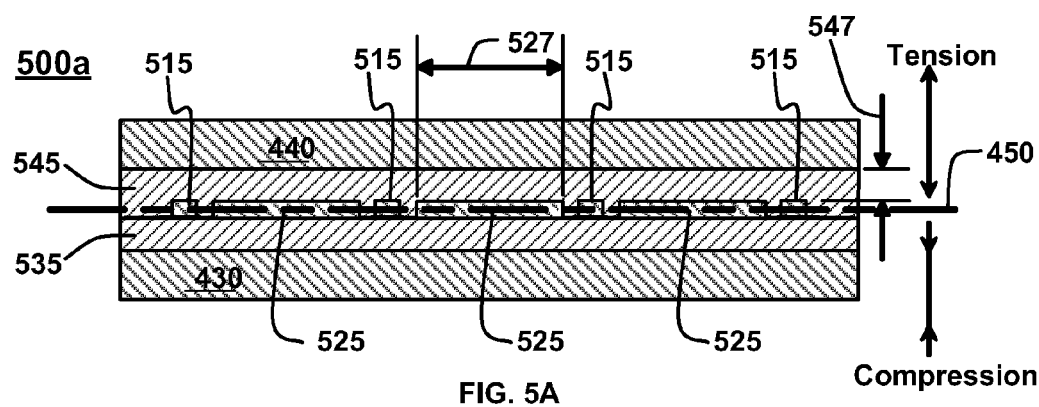
FIG. 5A is a cross-section of a flex cable/circuit in accordance with one embodiment of the present invention.

With reference to FIG. 5A, cross-section 500a of dynamic loop 420 of flex cable/circuit 400 is presented in accordance with one embodiment of the present invention. In accordance with an embodiment of the present invention flex cable/circuit 400 comprises base film 430 for receiving additional layers and films. Adhesively coupled to base film 430 is first adhesive layer 535. At least two signal traces 515 are adhesively coupled to first adhesive layer 535 and thus coupled with base film 430. At least one dummy trace 525 is positioned between two signal traces 515 and adhesively coupled to first adhesive layer 535, thus coupling with base film 430 and signal trace 515. Second adhesive layer 545 is adhesively coupled to signal traces 515, dummy trace 525, and first adhesive layer 535. Second adhesive layer 545 fills the volume between dummy trace 525 and signal traces 515. Cover film 440 is adhesively coupled to second adhesive layer 545. Second adhesive layer 545 fills the volume between signal traces 515, dummy trace 525, and cover film 440.

In accordance with an embodiment of the present invention, base film 430 and cover film 440 are chosen from a group of plastics known for their compatibility with the environment of HDD 100, for their manufacturability, and for their specific stiffness and flexibility. Examples of plastics in this group are: polyimide and polyester, commonly available from DuPont Corporation as KAPTON and MYLAR; and UPILEX, commonly available from Ube Industries. Signal trace 515 and dummy trace 525 comprise copper or an alloy of copper such as Cu—Ni—Si—Mg, Be—Cu—Ni, and Cu—Ti. In accordance with another embodiment of the present invention, signal trace 515 and dummy trace 525 comprise a non-copper conductor such as aluminum, carbon, silver ink, INCONEL, and constantan.

In accordance with another embodiment of the present invention, flex cable/circuit 400 comprises constrained layer damper (CLD) 460. CLD 460 is designed to primarily reduce the gain of the frequency of vibration. Constrained layer damping is well known and understood by one of ordinary skill in the art. In brief CLD 460 dampens vibration by cyclically deforming damping material 462 that is covered on at least one surface by constraining layer 464 that is stiffer than damping material 462. The stiffer constraining layer 464 constrains damping material 462 as it is cyclically deformed by the vibration and imparts strain into damping material 462. Damping material 462 resists deformation and converts the strain energy into small amounts of heat.

Figure 5B:
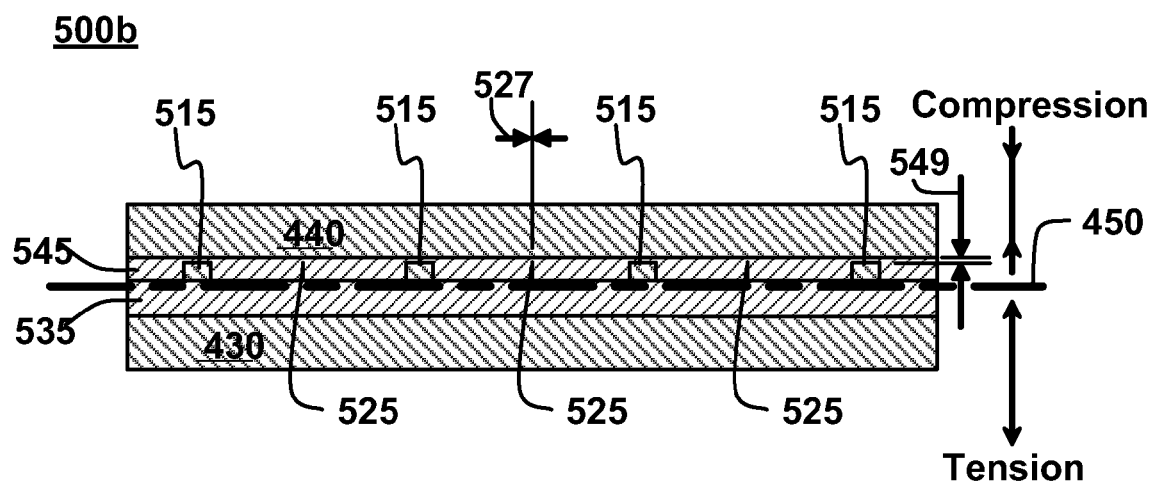
FIG. 5B is a cross-section of a flex cable/circuit in accordance with one embodiment of the present invention.
Figure 6:
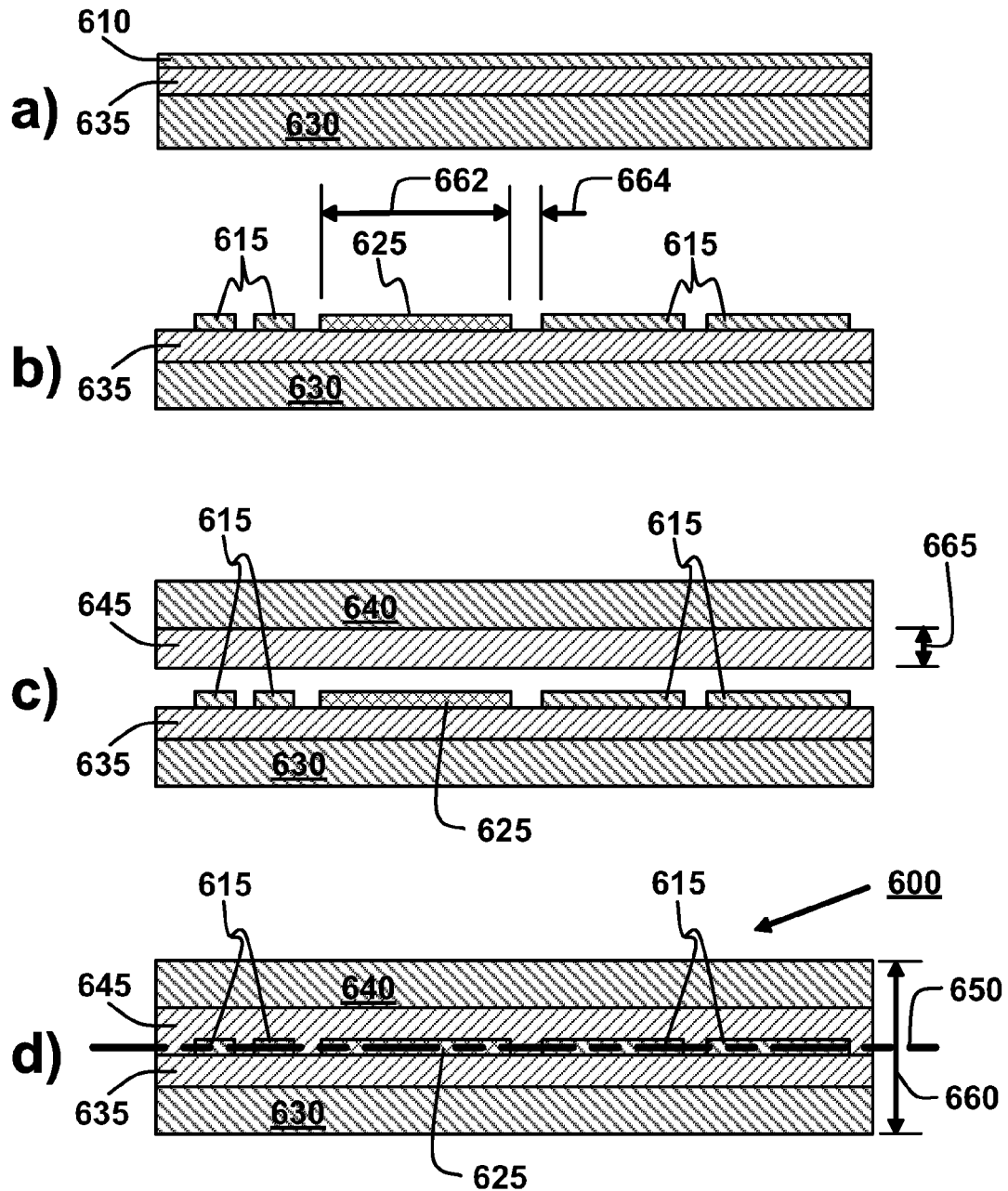
FIG. 6 (a-d) are cross-sections of a flex cable/circuit at process elements of fabrication in accordance with one embodiment of the present invention.

With reference to FIG. 5A and FIG. 5B, cross-section 500a and cross-section 500b of flex cable/circuit 400 are presented respectively in accordance with one embodiment of the present invention. As presented in cross-section 500a of FIG. 5A, a position of neutral axis 450 is a function of dummy trace 525. As width 527 of dummy trace 525 is increased, the volume that second adhesive layer 545 must fill is decreased, thus increasing distance 547 from cover film 440 to traces (515, 525) thereby positioning neutral axis 450 closer to traces (515, 525). As presented in cross-section 500b of FIG. 5B, a position of neutral axis 450 is a function of dummy trace 525. As width 527 of dummy trace 525 is decreased, the volume that second adhesive layer 545 must fill is increased, thus decreasing distance 549 from cover film 440 to traces (515, 525) thereby positioning neutral axis 450 further from traces (515, 525).

In accordance with an embodiment of the present invention, and as presented in cross-section 500a of FIG. 5A, the width 527 of dummy trace 525 is such that the volume that second adhesive layer 545 must fill decreases thus increasing distance 547 from cover film 440 to traces (515, 525) and positioning neutral axis 450 approximately coincident with the center of traces (515, 525). As presented in cross-section 500a of FIG. 5A, neutral axis 450 is positioned approximately coincident with the center of traces (515, 525). This allows compressive stress and tensile stress to be approximately equal within traces (515, 525) when flex cable/circuit 400 is flexed.

With reference to FIG. 5B, cross-section 500b of flex cable/circuit 400 is presented in accordance with another embodiment of the present invention. The width 527 of dummy trace 525 is such that the volume that second adhesive layer 545 must fill increases thus decreasing distance 549 from cover film 440 to traces (515, 525) and positioning neutral axis 450 away from the center of traces (515, 525). Hence, neutral axis 450 of flex cable/circuit 400 as presented in cross-section 500b is positioned such that signal trace(s) 515 has more compressive stress than tensile stress when flex cable/circuit 400 is flexed.

With reference to FIG. 4, FIG. 5A and FIG. 5B, flex cable/circuit 400 is presented in accordance with another embodiment of the present invention. As presented in cross-section 500a and cross-section 500b, flex cable/circuit 400 comprises more than one position for neutral axis 450 along the length of flex cable/circuit 400. The position of neutral axis 450 is a function of dummy trace 525. Width 527 of dummy trace 525 is based on a curvature of dynamic loop 420 which flex cable/circuit 400 will have when flex cable/circuit 400 is flexed.

Operation

FIG. 6A through FIG. 6D are cross-sections of a flex cable/circuit at process elements of fabrication in accordance with one embodiment of the present invention. Cross-sections of the flex cable/circuit presented in FIG. 6A through FIG. 6D are similar to cross-section 500a of flex cable/circuit 400 presented in FIG. 4 and FIG. 5A.

Figure 7:
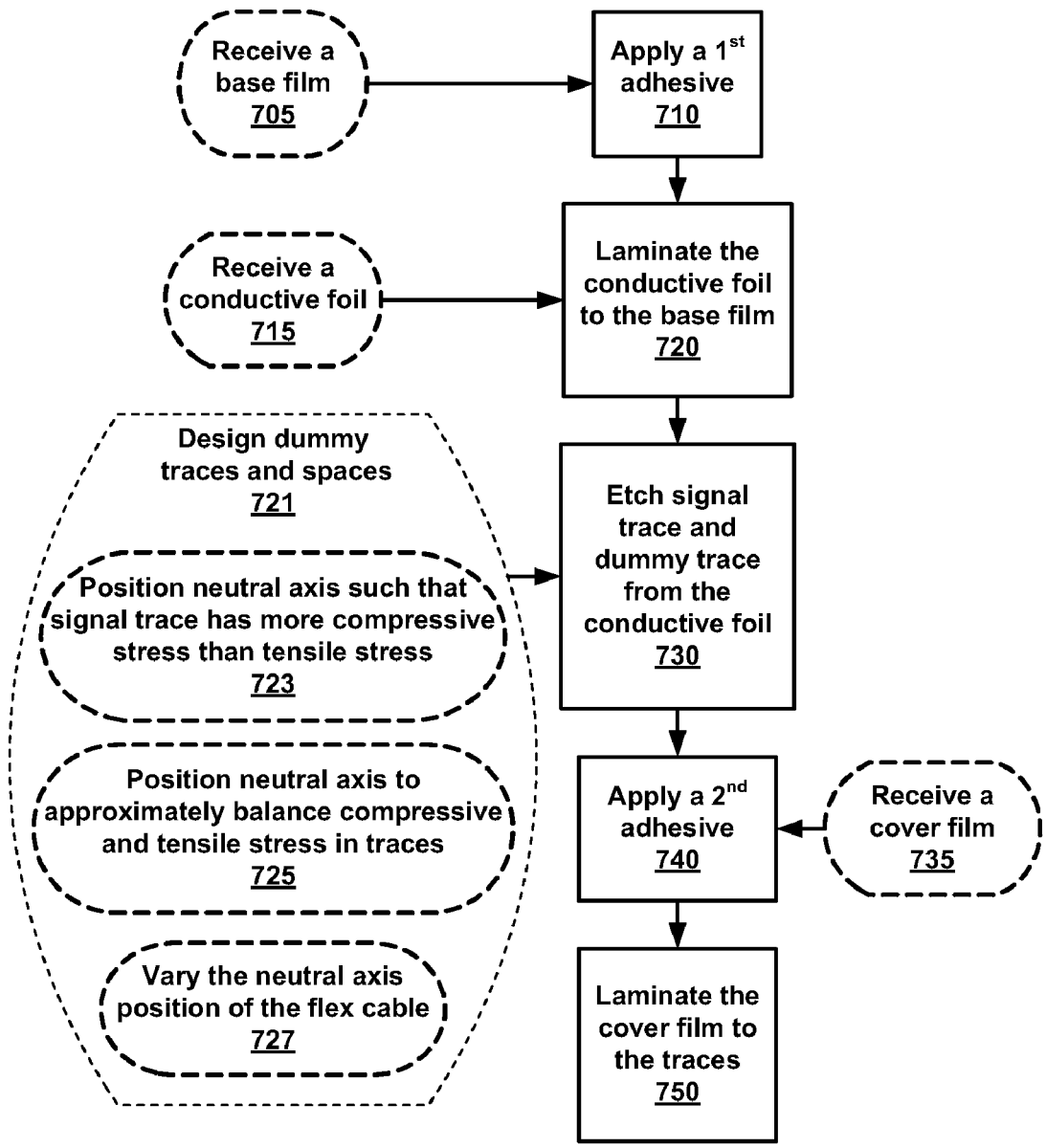
FIG. 7 is a flow chart illustrating a process for reducing fatigue cracks in a flex cable/circuit in accordance with one embodiment of the present invention.

FIG. 7 is a flow chart illustrating a process 700 for reducing fatigue cracks in a flex cable/circuit in accordance with one embodiment of the present invention. In one embodiment, process 700 is carried out by processors and electrical components under the control of computer readable and computer executable instructions. The computer readable and computer executable instructions reside, for example, in data storage features such as computer usable volatile and non-volatile memory. However, the computer readable and computer executable instructions may reside in any type of computer readable medium. Although specific components are disclosed in process 700, such components are examples of components for carrying out process 700. That is, the embodiments of the present invention are well suited to performing various other components or variations of the components recited in FIG. 7. Within the present embodiment, it should be appreciated that the components of process 700 may be performed by software, by hardware, by an assembly mechanism, through human interaction, or by any combination of software, hardware, assembly mechanism, and human interaction.

Process 700 will be described with reference to elements shown in FIG. 6A through FIG. 6D.

In one embodiment, as shown at element 705 of process 700, base film 630 is received into process 700. Base film 630 is chosen from a group of plastics known for their compatibility with the environment of HDD 100, for their manufacturability, and for their specific stiffness and flexibility. Examples of plastics in this group are: polyimide and polyester, commonly available from DuPont Corporation as KAPTON and MYLAR; and UPILEX, commonly available from Ube Industries.

In one embodiment, as shown at element 710 of process 700, first adhesive layer 635 is applied to base film 630. Adhesives that are typically used in flex cable/circuits are epoxy, pressure sensitive adhesive (PSA), and acrylic. Each adhesive has its own method of application which is well known and understood by one of ordinary skill in the art.

In one embodiment, as shown at element 715 of process 700, conductive foil 610 is received into process 700. In one embodiment conductive foil 610 comprises copper or an alloy of copper such as Cu—Ni—Si—Mg, Be—Cu—Ni, and Cu—Ti. In another embodiment conductive foil 610 comprises a non-copper conductor such as aluminum, carbon, silver ink, INCONEL, and constantan.

In one embodiment, as shown at element 720 of process 700, conductive foil 610 is laminated to base film 630 with first adhesive layer 635. The lamination process is dependent upon the adhesive used in first adhesive layer 635. Lamination processes are well known and understood by one of ordinary skill in the art. The lamination processes of element 720 comprise: pressing conductive foil 610 onto a wet film of epoxy applied on base film 630 and curing the epoxy; joining with pressure and elevated temperature conductive foil 610 to a dry film of PSA that has been placed onto base film 630 and reflowing the PSA; joining with pressure and elevated temperature conductive foil 610 to a dry film of acrylic that has been placed onto base film 630 and reflowing the acrylic.

In one embodiment, as shown at element 721 of process 700, dummy trace 625 is designed. Width 662 of dummy trace 625 and distance 664 from dummy trace 625 to signal trace 615 is defined based on thickness 665 of second adhesive layer 645 and the desired position of neutral axis 650. Second adhesive layer 645 is available in thicknesses of discrete increments, such as 12.5, 25, 50, and 100 microns. These discrete incremental thicknesses of second adhesive layer 645 may not be sufficient to achieve sufficient thickness 660 of flex cable/circuit 600, such that neutral axis 650 is positioned to mitigate fatigue cracks in signal trace 615. The combinations of width 662 of dummy trace 625 and distance 664 from dummy trace 625 to signal trace 615 are infinite within the capabilities of etching conductive foil 610, and provide fine positioning of neutral axis 650 previously not possible.

In one embodiment, as shown at element 723 of process 700, width 662 of dummy trace 625 and distance 664 from dummy trace 625 to signal trace 615 is defined such that when second adhesive layer 645 is reflowed, second adhesive layer 645 remaining between signal trace 615 and cover film 640, positions neutral axis 650 such that signal trace 615 has more compressive stress than tensile stress when flex cable/circuit 600 is flexed.

In another embodiment, as shown at element 725 of process 700, width 662 of dummy trace 625 and distance 664 from dummy trace 625 to signal trace 615 is defined such that when second adhesive layer 645 is reflowed, second adhesive layer 645 remaining between signal trace 615 and cover film 640 positions neutral axis 650 such that signal trace 615 has approximately equal compressive stress and tensile stress when flex cable/circuit 600 is flexed.

In another embodiment, as shown at element 727 of process 700, width 662 of dummy trace 625 and distance 664 from dummy trace 625 to signal trace 615 is defined such that when second adhesive layer 645 is reflowed, second adhesive layer 645 remaining between signal trace 615 and cover film 640 varies the position of neutral axis 650 along the length of flex cable/circuit 600 when flex cable/circuit 600 is flexed. The design of width 662 of dummy trace 625 and distance 664 from dummy trace 625 to signal trace 615 utilizes previous knowledge of the curvature flex cable/circuit 600 will have when it is flexed.

In one embodiment, as shown at element 730 of process 700, at least two signal traces 615 and dummy trace 625 are etched from conductive foil 610. Dummy trace 625 is positioned between two signal traces 615. By positioning dummy trace 625 between two signal traces 615, dummy trace 625 consumes a volume that would normally be filled by second adhesive layer 645.

In one embodiment, as shown at element 735 of process 700, cover film 640 is received into process 700. Cover film 640 is chosen from a group of plastics known for their compatibility with the environment of HDD 100, for their manufacturability, and for their specific stiffness and flexibility. Examples of plastics in this group are: polyimide and polyester, commonly available from DuPont Corporation as KAPTON and MYLAR; and UPILEX, commonly available from Ube Industries.

In one embodiment, as shown at element 740 of process 700, second adhesive layer 645 is applied to cover film 640. Adhesives that are typically used in flex cable/circuits are epoxy, pressure sensitive adhesive (PSA), and acrylic. Each adhesive has its own method of application which is well known and understood by one of ordinary skill in the art.

In one embodiment, as shown at element 750 of process 700, cover film 640 is laminated to signal trace 615 with second adhesive layer 645. Some of second adhesive layer 645 flows into the spaces between signal trace 615 and dummy trace 625. The remaining un-flowed second adhesive layer 645 remains between cover film 640 and traces (615, 625). The un-flowed second adhesive layer 645 between cover film 640 and traces (615, 625) effects thickness 660 of flex cable/circuit 600 and therefore effects the position of neutral axis 650.

The present invention, in the various presented embodiments reduces fatigue cracks in a flex cable/circuit by minimizing tensile stress in the signal traces of the flex cable/circuit. In so doing the reliability of a device such as an HDD is improved and customer satisfaction is increased. Embodiments of the present invention enable a fine adjustment of the neutral axis position by enabling the precision inherent in fabricating dummy traces to function as an adjustment device for positioning the neutral axis of the flex cable and thereby minimizing tensile stress in the signal traces of the flex cable/circuit.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments described herein were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A flex circuit comprising:
   a base film;
   a first adhesive layer coupled with said base film;
   at least two signal traces coupled with said first adhesive layer;
   at least one dummy trace positioned between said two signal traces and coupled with said first adhesive layer;
   a second adhesive layer coupled with said signal traces, said dummy trace and said first adhesive layer; and
   a cover film coupled with said second adhesive layer, wherein a position of a neutral axis of said flex circuit is a function of said dummy trace and wherein said neutral axis is further positioned such that said signal trace has more compressive stress than tensile stress, when said flex circuit is flexed.

2. The flex circuit of claim 1 wherein said base film and said cover film are selected from the group of polymers consisting of: polyimide, UPILEX, KAPTON, polyester, and MYLAR.

3. The flex circuit of claim 1 wherein said signal trace and said dummy trace comprise copper.

4. The flex circuit of claim 1 wherein said flex circuit further comprises a constrained layer damper.

5. The flex circuit of claim 1 wherein said neutral axis is positioned such that said signal trace has approximately equal compressive stress and tensile stress, when said flex circuit is flexed.

6. The flex circuit of claim 1 wherein said neutral axis further comprises more than one position along the length of said flex circuit based on a curvature, said flex circuit will have when said flex circuit is flexed.

7. A hard disk drive comprising:
- a flex cable for communicatively coupling an actuator assembly to a printed circuit board, said flex cable comprising:
  - a base film;
  - a first adhesive layer coupled with said base film;
  - at least two signal traces coupled with said first adhesive layer;
  - at least one dummy trace positioned between said two signal traces and coupled with said first adhesive layer;
  - a second adhesive layer coupled with said signal traces, said dummy trace and said first adhesive layer; and
  - a cover film coupled with said second adhesive layer, wherein a position of a neutral axis of said flex cable is a function of said dummy trace and wherein said neutral axis is further positioned such that said signal trace has more compressive stress than tensile stress, when said flex cable is flexed.

8. The hard disk drive of claim 7 wherein said base film and said cover film are selected from the group of polymers consisting of: polyimide, UPILEX, KAPTON, polyester, and MYLAR.

9. The hard disk drive of claim 7 wherein said signal trace and said dummy trace comprise copper.

10. The hard disk drive of claim 7 wherein said flex cable further comprises a constrained layer damper.

11. The hard disk drive of claim 7 wherein said neutral axis is positioned such that said signal trace has approximately equal compressive stress and tensile stress, when said flex cable is flexed.

12. The hard disk drive of claim 7 wherein said neutral axis further comprises more than one position along the length of said flex cable based on a curvature, said flex cable will have when said flex cable is flexed.

* * * * *